United States Patent [19]

Brandt et al.

[11] Patent Number: 4,827,672
[45] Date of Patent: May 9, 1989

[54] ABRASIVE CUTTING WHEEL SYSTEM

[75] Inventors: David L. Brandt, Zion; Ralph R. Doyle, Arlington Heights, both of Ill.

[73] Assignee: Buehler Ltd., Lake Bluff, Ill.

[21] Appl. No.: 42,934

[22] Filed: Apr. 27, 1987

[51] Int. Cl.$^4$ ............................................. B24B 49/00
[52] U.S. Cl. ............................... 51/165.90; 51/165 R; 51/92 R; 51/233; 91/4 R; 91/275
[58] Field of Search ............... 51/165.9, 92 R, 71, 51/83 R, 233, 165 R; 91/4 R, 275, 463, 465

[56] References Cited

U.S. PATENT DOCUMENTS

| | | | |
|---|---|---|---|
| 2,371,085 | 3/1945 | Waters | 51/165.9 X |
| 3,119,306 | 1/1964 | Colonius et al. | 91/4 R X |
| 3,507,189 | 4/1970 | Beckett et al. | 91/4 R |
| 3,517,659 | 6/1970 | Stewart et al. | 51/165 X |
| 3,812,624 | 5/1974 | Dunn | 51/165.9 X |
| 3,898,771 | 8/1975 | Kuniholm | 51/165.9 |
| 4,066,004 | 1/1978 | Alcalay | 91/275 X |
| 4,177,607 | 12/1979 | Toda | 51/165.91 X |
| 4,197,786 | 4/1980 | Dillon | 51/165.9 X |
| 4,590,711 | 5/1986 | Sollami | 51/165.9 X |

FOREIGN PATENT DOCUMENTS

| | | | |
|---|---|---|---|
| 0443748 | 8/1965 | Japan | 51/165 R |
| 0014463 | 1/1984 | Japan | 51/166 R |
| 0146458 | 7/1986 | Japan | 51/165.77 |
| 1041276 | 9/1983 | U.S.S.R. | 51/165.77 |
| 1200557 | 7/1970 | United Kingdom | 91/4 R |

Primary Examiner—Frederick R. Schmidt
Assistant Examiner—Shirish Desai
Attorney, Agent, or Firm—Allegretti & Witcoff, Ltd.

[57] ABSTRACT

An abrasive cutting system has an abrasive cutting wheel, a holder for the object to be cut, and means for advancing and retracting the wheel and holder relative to each other. Preferably, the advancing and retracting means is connected to the holder, while the cutting wheel is stationary except for its rotary motion. In accordance with this invention, apparatus for automatically, intermittently advancing the wheel and holder toward each other while the wheel is cutting the object is provided. This automatic, intermittent advancement provides significant improvements over a uniform rate of advancement.

14 Claims, 1 Drawing Sheet

ABRASIVE CUTTING WHEEL SYSTEM

BACKGROUND OF THE INVENTION

Abrasive cutting wheels are used for a large number of purposes. Specifically, one may use abrasive cutting wheels for the preparation of samples of small metal objects or the like which are embedded in a plastic mounting. One then cuts through or along the sample in preparation for microstructural analysis of the material of the object, typically before polishing steps. By such procedures, wafers of materials or small metal parts, printed circuit boards, composite materials, and the like may be analyzed as to their microstructure, while the small material samples are conveniently embedded in the plastic mounting.

Conventional apparatus is available for such abrasive wheel cutting. However, in many cases, the operator has had to carefully monitor the cutting process, and, by a manual control, intermittently advance the abrasive wheel into the object to be cut. Such intermittent advancement prevents particles from becoming embedded in the abrasive surface of the wheel, which results in the burnishing and overheating of the article being cut. Such overheating, if not avoided, can spoil the object for its intended purpose, for example, analysis of the normal microstructure of its surface. Additionally, excessive uniform advancement of the abrasive wheel into the object to be cut can actually cause the wheel to deflect due to adhering material, resulting in a deviation from the desired cutting path.

By this invention, improvements in the quality of cutting processes with abrasive cutting wheels can be achieved, without the need for a skilled operator to oversee the process to provide manual intermittent advancement of the wheel into the object to be cut by a manual control, which, is of course, a time consuming matter. Instead, by this invention, an automatic, desired intermittent advancement of the abrasive wheel can be provided to achieve the significant advantages of this invention. By this invention, abrasive wheel life may be extended, and improvements in the quality of the cut surface of the object cut may make it possible to avoid a later rough polishing step which might otherwise be required prior to microstructural analysis of the cut piece.

DESCRIPTION OF THE INVENTION

In this invention, an abrasive cutting system is provided having an abrasive cutting wheel, plus means for holding the object to be cut, and means for advancing and retracting the wheel and holding means relative to each other. In accordance with this invention, added means are provided for automatically, intermittently advancing the wheel and holding means toward each other while the wheel is cutting the object, for improved cutting having advantages as described above.

Typically, the advancing and retracting means is connected to one of the wheel and holding means, with the other being stationary. Particularly, it is preferred for the advancing and retracting means to be connected to the holding means, while the cutting means is stationary except for its rotary motion.

The added means for automatically, intermittently, advancing the wheel and holding means may comprise at least partially pneumatic means for driving the wheel and holding means together. As a result of this, between intermittent advancements, a small spontaneous retraction can take place due to the natural compressability of gas in the pneumatic system, which permits a small retraction when the advancement is shut off or vented, in response to the strong back pressures encountered between the wheel and object to be cut. This facilitates removal of debris from between the cutting wheel and the object, which in turn helps to accomplish the desirable advantages of this invention.

Limit switch means may be provided for activation at a predetermined maximum advancement of the wheel and holding means. The activated limit switch, in turn, activates added means for mechanically retracting the wheel and holding means.

The means for advancing and retracting may comprise a double acting piston in a cylinder connected to one of the cutting wheel and holding means. Pressurized fluid means may communicate with both sides of the piston for advancing and retracting the piston in the cylinder. Control means are then provided for controlling the flow of pressurized fluid into and out of the cylinder for controlling the position of the piston. Thus, as the piston is advanced, the cutting wheel and holding means are advanced together, and as the piston is retracted, the cutting wheel and holding means are retracted relative to each other.

DESCRIPTION OF SPECIFIC EMBODIMENT

Figure 1:
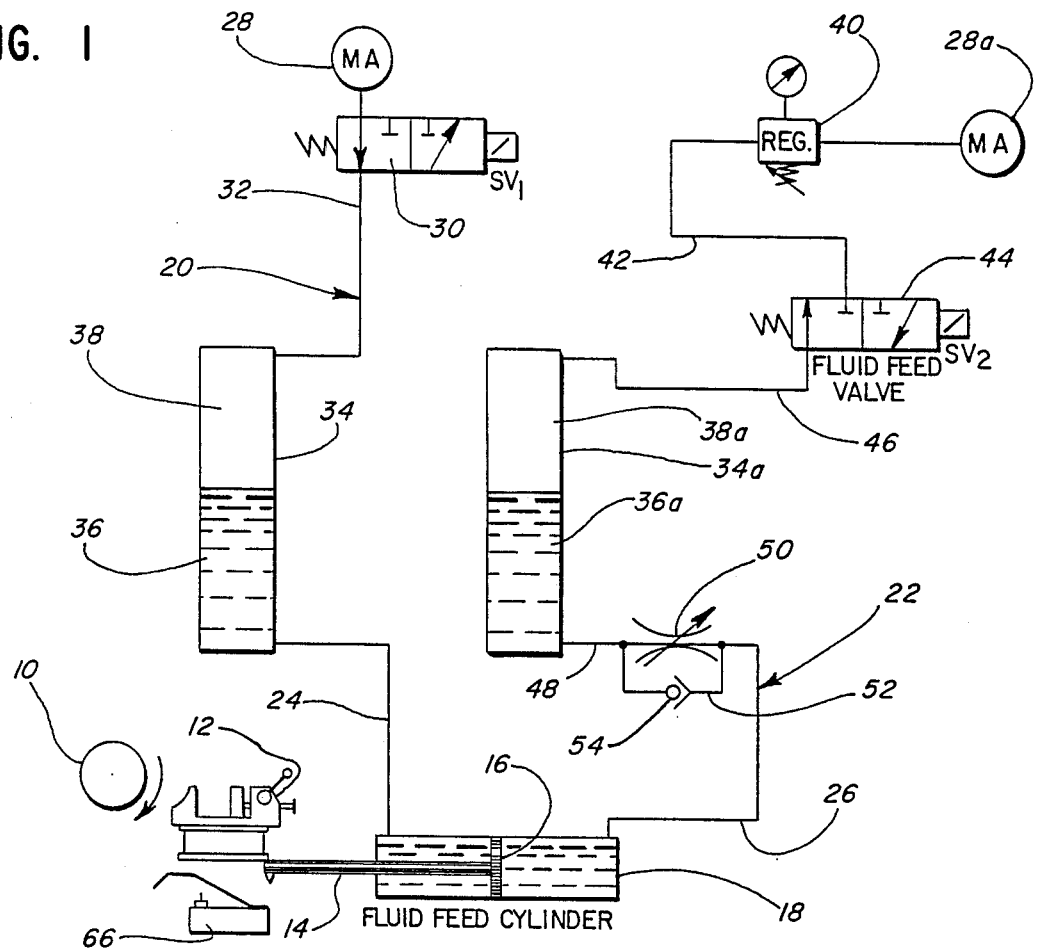
FIG. 1 is a schematic diagram of the abrasive cutting system of this invention.

Referring to the drawings, FIG. 1 shows a portion of cutting wheel 10, plus means 12 for holding the object to be cut. Means 12 may be advanced and retracted relative to cutting wheel 10 by the advancement and retraction of shaft 14, which terminates in double acting piston 16 operating in cylinder 18.

Two hydraulic-pneumatic systems 20, 22 are provided, one of which communicates with the interior of cylinder 18 at a forward portion thereof through conduit 24, and the other of which communicates with cylinder 18 at a rearward portion thereof through conduit 26. Turning first to system 20, pressurized air from source 28 passes through venting valve 30 which is operated by solenoid SV1. In the position shown, pressurized air passes through conduit 32 into chamber 34 having hydraulic oil 36 in the lower portion thereof and an air space 38 in the upper portion. From there, hydraulic oil, pressurized by pressurized air in space 38, has a flow path 24 into the portion of cylinder 18 which is forward of piston 16.

Similarly, with respect to system 22, pressurized air from main air supply 28a, passes through pressure regulator 40, to achieve a desired pressure to the system which will give the desired advancement pressure for holder 12 against wheel 10. Such pressurized air passes through conduit 42 into venting valve 44 which is operated by solenoid SV2. As shown, venting valve 44 is in its venting position so that conduit 46 is open to ambient air, to permit piston 16 to be pushed into withdrawn position, causing holder 12 to withdraw with it, relative to wheel 10. When solenoid SV2 causes valve 44 to change position, conduits 42 and 46 are connected, for the delivery of pressurized air to chamber 34a, similar to chamber 34 in that it contains a level of hydraulic oil 36a and an air space 38a. Hydraulic oil 36a can communicate through conduit 48 through adjustable flow restriction valve 50 to adjust the rate of flow of hydraulic oil into chamber 18, to advance piston 16 at a desired rate of advancement when oil is flowing into cylinder 18.

Valves 30, 44 are arranged so that only one such valve is providing pressurized air to its respective system 20, 22. When system 20 is actuated, piston 16 retracts, pushing hydraulic oil through conduit 26 and through shunt passage 52, which includes one way valve 54, so that shunt passage 52 may only provide reverse flow of hydraulic oil from cylinder 18 to chamber 34a, but not forward flow. There is no other flow restriction in shunt passage 52, so that while hydraulic oil may flow from chamber 36a to cylinder 18 with slow passage through controlled restriction 50, the passage of oil from cylinder 18 back to chamber 34a may be rapid, with flow through shunt circuit 52.

Figure 2:
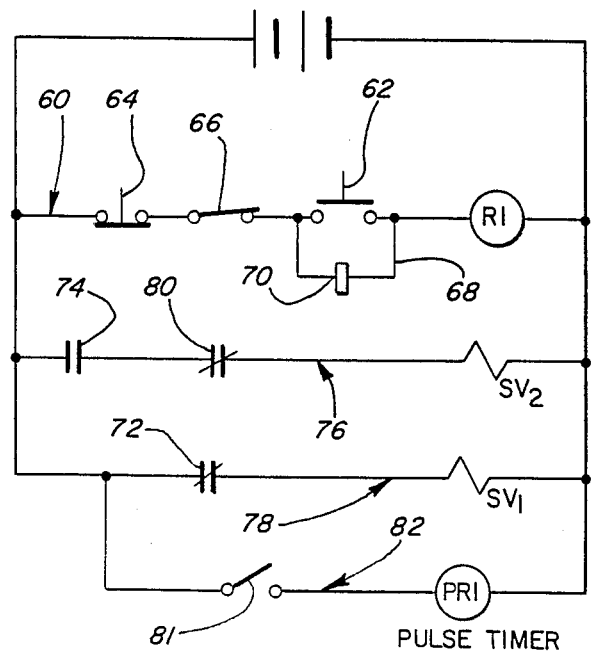
FIG. 2 is a partial electrical circuit diagram of the abrasive cutting system of FIG. 1.

Turning to FIG. 2, a schematic partial electrical diagram for the system of FIG. 1 is disclosed.

The electrical circuit carries a first electrical path 60 which includes start switch 62, which is used as a control to initiate operation of the system for advancing holder 12 toward cutting wheel 10. Stop button 64 is provided, being in normally closed position, but present to terminate action if desired. Limit switch 66 is also provided, being in normally closed configuration to permit electrical current to pass through circuit 60 branch until actuated.

Shunt circuit 68 includes a contact relay 70 so that current continues to flow when start button 62 has retracted and is no longer closing the circuit.

Relay R1 serves to deactivate contact 72 which is normally activated and, at the same time to activate contact 74 which is normally deactivated.

Accordingly, before start button 62 is pressed, electrical current passes through circuit branch 78, so that solenoid SV1 holds valve 30 open, to activate system 20 and retract piston 16. However, before start button 62 is pressed, a current never passes through circuit branch 76 because contact 74 is always deactivated in that circumstance.

After start button 62 is pressed, relay R1 energizes both contacts 72 and 74, causing contact 72 to deactivate with the result that current stops flowing through circuit branch 78, while relay R1 activates contact 74, permitting current to flow through circuit 76, since contact 80 is in a normally closed, current conducting configuration.

The result of this is that the flow of current through circuit branch 76 actuates solenoid SV2 to open valve 44 while valve 30 is closed to venting configuration. Pressurized air from source 28a causes hydraulic oil to enter chamber 18, advancing piston 16 and holder 12 toward cutting wheel 10.

If it is desired to utilize the automatic, intermittent advancement of this invention, one may close switch 81 of circuit branch 82, to activate pulse timer PR1. Pulse timer PR1 is electrically connected to contact 80, which is intermittently deactivated in a manner which may be controlled by pulse timer PR1. The rate of the intermittent opening of deactivation of contact 80 may be set as desired, to cause intermittent current flow through circuit branch 76. As a result of this, solenoid SV2 and valve 44 are only intermittently actuated, and valve 44 vents to atmosphere between actuations. Thus, the rate of advancement of piston 16 and holder 12 toward wheel 10 is correspondingly intermittent, with the pressure of hydraulic fluid in cylinder 18 rapidly dropping to ambient between pulses of pressure. Thus, holder 12 is advanced toward cutter wheel 10 at the desired intermittent rate, to achieve the advantages of this invention.

When holder 12 is advanced to a sufficient degree, limit switch 66 is actuated, which has the result of breaking the flow of current through circuit branch 60. This deactivates relay R1, which in turn causes contact 74 in circuit branch 76 to deactivate, which deactivates solenoid SV2. Thus valve 44 returns to its venting mode.

At the same time, contact 72 returns to its normal, closed condition, in which current can flow through circuit branch 78, which activates solenoid SV1 of valve 30. Thus, valve 30 moves from its natural, venting condition to permit pressurized air to pass through system 20 to enter cylinder 18 through line 24 to cause piston 16 and holder 12 to retract.

At this point, the system stops operation until start button 62 is once again depressed.

Upon the pressing of stop button 64, it can be seen that current ceases to flow through circuit branch 60, deactivating relay R1, which has the same effect as depressing of limit switch 66. In that circumstance also, current flows through circuit branch 78 to actuate solenoid SV1 and valve 30 to cause piston 16 and holder 12 to retract.

Thus, the apparatus of this invention provides an advancement system in which the advancement may be uniform, if desired, but also may be intermittent as is preferred in this invention, for achieving the significant advantages as described.

The above has been offered for illustrative purposes only, and is not intended to limit the scope of the invention of this application, which is as defined in the claims below.

That which is claimed is:

1. In an abrasive cutting system having an abrasive cutting wheel, means for holding the object to be cut, and means for advancing and means for retracting said wheel and holding means relative to each other, the improvement comprising, in combination:
   added means for automatically intermittently advancing said wheel and holding means toward each other while the wheel is cutting said object, said intermittent advancing being set at predetermined times, for improved cutting.

2. The cutting system of claim 1 in which said advancing and retracting means is connected to said holding means, while said cutting wheel is stationery except for its rotary motion.

3. The cutting system of claim 1 in which said added means for automatically, intermittently advancing said wheel and holding means comprises at least partially pneumatic means for driving said wheel and holding means together, whereby between intermittent advancements, small, spontaneous retraction takes place to facilitate removal of debris from between the cutting wheel and said object.

4. The cutting system of claim 1 in which limit switch means are activated at a predetermined maximum advancement of said wheel and holding means, to activate added means for mechanically retracting said wheel and holding means.

5. The cutting system of claim 1 in which said means for advancing and retracting comprises a double acting piston in a cylinder connected to one of said wheel and holding means pressurized fluid means communicating with both sides of said piston for advancing and retracting said piston in the cylinders, and control means controlling the flow of pressurized fluid into and out of said cylinder for controlling the position of said piston.

6. The abrasive cutting system of claim 1 in which said means for advancing said wheel and holding means relative to each other utilizes pressurized fluid flow from a source to a piston and cylinder through a fluid feed valve, and means for automatically, intermittently switching said valve between open and closed positions, whereby the wheel and holding means are automatically advanced toward each other with a plurality of intermittent pauses in said advancement.

7. The abrasive cutting system of claim 6 in which said fluid feed valve in the closed position prevents the flow of pressurized fluid to the piston and cylinder, but permits the reverse venting of pressurized fluid from the piston and cylinder to permit the pressure of fluid therein to drop.

8. In an abrasive cutting system having an abrasive cutting wheel, means for holding the object to be cut, and means for advancing and means for retracting said holding means relative to the abrasive cutting wheel, the improvement comprising, in combination:
said means for advancing said wheel toward the holding means utilizing pressurized fluid flowing from a source to a piston and cylinder through a fluid feed valve, and means for automatically intermittently switching said valve between open and closed positions, whereby the wheel is automatically advanced toward the holding means with a plurality of intermittent pauses in said advancement while the wheel is cutting said object, for improved cutting and in which said fluid feed valve in the closed position prevents the flow of pressurized fluid to the piston and cylinder, but permits the reverse venting of pressurized fluid from the piston and cylinder to permit the pressure of fluid therein to drop, whereby between intermittent advancements, small, spontaneous retraction can take place to facilitate removal of debris from between the cutting wheel and said object.

9. The cutting system of claim 8 in which limit switch means are activated at a predetermined maximum advancement of said wheel and holding means, to activate said means for retracting said wheel and holding means.

10. The cutting system of claim 9 in which said piston is a double acting piston in said cylinder, said means for advancing and means for retracting said holding means relative to the wheel each including pressurized fluid means respectively communicating with one side of said piston for respectively advancing and retracting said piston in the cylinder.

11. In an abrasive cutting system having an abrasive cutting wheel, means for holding the object to be cut, and means for advancing and means for retracting said wheel and holding means relative to each other, the improvement comprising, in combination:
added means for automatically intermittently advancing said wheel and holding means toward each other while the wheel is cutting said object, for improved cutting, and in which limit switch means are activated at a predetermined maximum advancement of said wheel and holding means, to activate said added means for mechanically retracting said wheel and holding means.

12. The abrasive cutting system of claim 11 in which said advancing means utilizing pressurized fluid comprises at least partially pneumatic means for driving said wheel and holding means together, whereby between intermittent advancement, small, spontaneous retraction takes place to facilitate removal of debris from between the cutting wheel and said object.

13. The cutting system of claim 12 in which limit switch means are activated at a predetermined maximum advancement of said wheel and holding means, to activate said added means for mechanically retracting said wheel and holding means.

14. The abrasive cutting system of claim 13 in which said means for advancing and retracting comprises a double acting piston and a cylinder connected to one of said wheel and holding means, said means for advancing and said means for retracting comprising pressurized fluid means communicating with both sides of said piston for advancing and retracting said piston in the cylinders, and control means controlling the flow of pressurized fluid into and out of said cylinders for control of the position of said piston.

* * * * *